(12) United States Patent
Sugie

(10) Patent No.: US 9,143,108 B2
(45) Date of Patent: Sep. 22, 2015

(54) VARIABLE GAIN AMPLIFIER, CURRENT DETECTING CIRCUIT USING THE SAME, MOTOR DRIVING CIRCUIT AND ELECTRONIC APPARATUS

(71) Applicant: Rohm Co., Ltd., Kyoto (JP)

(72) Inventor: Hisashi Sugie, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 301 days.

(21) Appl. No.: 13/896,441

(22) Filed: May 17, 2013

(65) Prior Publication Data

US 2013/0307453 A1 Nov. 21, 2013

(30) Foreign Application Priority Data

May 18, 2012 (JP) ................................ 2012-114731

(51) Int. Cl.
*H03F 3/00* (2006.01)
*H03G 3/30* (2006.01)
*H03G 1/00* (2006.01)

(52) U.S. Cl.
CPC ............... *H03G 3/30* (2013.01); *H03G 1/0088* (2013.01)

(58) Field of Classification Search
USPC ................. 330/250, 252, 278, 282, 61 R, 69; 318/619, 626, 677
See application file for complete search history.

(56) References Cited

U.S. PATENT DOCUMENTS

| | | | | |
|---|---|---|---|---|
| 3,629,720 A | * | 12/1971 | Sedra et al. ..................... | 330/86 |
| 5,523,712 A | * | 6/1996 | Miyabe et al. ................. | 327/355 |
| 6,137,365 A | * | 10/2000 | Wakairo et al. ................ | 330/282 |
| 6,819,768 B1 | * | 11/2004 | Sculley ........................ | 381/104 |

FOREIGN PATENT DOCUMENTS

JP 2000-166285 6/2000

* cited by examiner

*Primary Examiner* — Bentsu Ro
(74) *Attorney, Agent, or Firm* — Fish & Richardson P.C.

(57) ABSTRACT

A variable gain amplifier includes: a first input terminal, a second input terminal and an output terminal; an operational amplifier; a first resistor interposed between the first input terminal and an inverted input terminal of the operational amplifier; second and third resistors interposed between the inverted input terminal and the output terminal; and a fourth variable resistor having a first terminal connected to a node between the second resistor and the third resistor and a second terminal connected to the non-inverted input terminal, wherein the fourth variable resistor includes a resistance pass including a resistor and a switch.

8 Claims, 5 Drawing Sheets

VARIABLE GAIN AMPLIFIER, CURRENT DETECTING CIRCUIT USING THE SAME, MOTOR DRIVING CIRCUIT AND ELECTRONIC APPARATUS

CROSS-REFERENCE TO RELATED APPLICATION

This application is based upon and claims the benefit of priority from Japanese Patent Application No. 2012-114731, filed on May 18, 2012, the entire contents of which are incorporated herein by reference.

TECHNICAL FIELD

The present disclosure relates to a variable gain amplifier.

BACKGROUND

Voltage amplifiers are provided in various analog signal processing circuits. FIG. 1 is a circuit diagram of a conventional variable gain amplifier 100r. As shown in FIG. 1, the variable gain amplifier 100r is an inverting amplifier that includes an operational amplifier 10, an input resistor Rin and a feedback resistor Rfb. The input resistor Rin is interposed between an inverted input terminal of the operational amplifier 10 and a first input terminal Pi1. A non-inverted terminal of the operational amplifier 10 is connected to a second input terminal Pi2 and an output terminal of the operation amplifier 10 is connected to an overall output terminal Po of the variable gain amplifier 100r. The feedback resistor Rfb is interposed between the output terminal and the inverted input terminal of the operational amplifier 10.

A gain Av of the variable gain amplifier 100r is given by the following Equation 1.

$$Av = Rfb/Rin \qquad \text{[Equation 1]}$$

The gain Av, which is inversely proportional to the input resistor Rin and is proportional to the feedback resistor Rfb, may be controlled by varying at least one of Rfb and Rin. Varying the value of the feedback resistor Rfb is desired due to its controllability and design flexibility.

The feedback resistor Rfb includes a plurality of resistors R10 to R14 connected in series, and switches SW1 to SW4 connected in parallel to the respective resistors R11 to R14. When all of the switches SW1 to SW4 are switched OFF, the gain Av of the variable gain amplifier 100r takes the maximum value which is equal to (R10+R11+R12+R13+R14)/Rin. When an i-th switch SWi is switched ON, a corresponding resistor R1i is bypassed to decrease the resistance of the feedback resistor Rfb leading to a decrease in the value of the gain Av.

The inventor has reviewed the variable gain amplifier 100r and was aware of the following problem. On-resistance of an ideal switch is zero. However, an actual switch using a MOSFET (Metal Oxide Semiconductor Field Effect Transistor) has an on-resistance. Accordingly, when the i-th switch SWi is switched on, the total resistance value of the feedback resistor Rfb is affected by on-resistance Roni of the switch SWi. Specifically, each switching state and the gain Av of the variable gain amplifier 100r have the following relationships.

SW1 to SW4 all OFF $$Av = (R10+R11+R12+R13+R14)/Rin \qquad (2a)$$

SW1 ON and SW2 to SW4 OFF $$Av = (Ron_1+R12+R13+R14)/Rin \qquad (2b)$$

SW1 and SW2 ON and SW3 and SW4 OFF $$Av = (Ron_1+Ron_2+R13+R14)/Rin \qquad (2c)$$

SW1 to SW3 ON and SW4 OFF $$Av = (Ron_1+Ron_2+Ron_3+R14)/Rin \qquad (2d)$$

SW1 to SW4 all ON $$Av = (Ron_1+Ron_2+Ron_3+Ron_4)/Rin \qquad (2e)$$

In other words, in the variable gain amplifier 100r of FIG. 1, the on-resistance of the switches causes an unavoidable gain error.

SUMMARY

The present disclosure provides some embodiments of a variable gain amplifier which is capable of controlling a gain with high precision.

According to one embodiment of the present disclosure, a variable gain amplifier is configured to include: a first input terminal, a second input terminal and an output terminal; an operational amplifier having a non-inverted input terminal connected to the second input terminal and an output connected to the output terminal; a first resistor interposed between the first input terminal and an inverted input terminal of the operational amplifier; second and third resistors interposed in series between the inverted input terminal of the operational amplifier and the output terminal; and a fourth variable resistor having a first terminal connected to a node between the second resistor and the third resistor and a second terminal connected to the non-inverted input terminal of the operational amplifier, wherein the fourth variable resistor includes a plurality of resistance passes interposed in parallel between the first terminal and the second terminal, each of the resistance passes including a resistor and a switch connected in series.

When resistances of the first to third resistors and the fourth variable resistors are denoted by R1, R2, R3 and R4, respectively, a gain Av of the variable gain amplifier may be expressed as below:

$$Av = (R1+R2+R1 \times R2/R4)/R1 \qquad \text{[Equation 3]}$$

where the resistance of the fourth variable resistor is resultant resistance of the plurality of resistance passes connected in parallel. Since on-resistance of the switch is known, the resistance of the fourth variable resistor may be designed to have regular, discrete values with high precision taking the on-resistance of the switch into account. Furthermore, the gain of the variable gain amplifier may be controlled with high precision.

The sum of the resistor resistance of each resistance pass and the on-resistance of the switch may be binary weighted.

According to another embodiment of the present disclosure, a current detecting circuit is configured to include: a detecting resistor disposed on a path of current to be detected; and a variable gain amplifier which has a first input terminal connected to one end of the detecting resistor and a second input terminal connected to the other end of the detecting resistor and amplifies a voltage drop of the detecting resistor. With this configuration, since a gain of the variable gain amplifier can be controlled with high precision, current can be detected with high precision by setting the gain of the variable gain amplifier in response to designed resistance of the detecting resistor and a characteristic deviation of the detecting resistor.

According to another embodiment of the present disclosure, a motor driving circuit is configured to include a detecting resistor disposed on a path of a motor to be driven; a variable gain amplifier which has a first input terminal connected to one end of the detecting resistor and a second input terminal connected to the other end of the detecting resistor and amplifies a voltage drop of the detecting resistor; and a driver configured to drive the motor based on an output voltage of the variable gain amplifier.

According to another embodiment of the present disclosure, an electronic apparatus is configured to include a motor; and a motor driving circuit configured to drive the motor, wherein the motor driving circuit includes: a detecting resistor disposed on a path of the motor to be driven; a variable gain amplifier which has a first input terminal connected to one end of the detecting resistor and a second input terminal connected to the other end of the detecting resistor and amplifies a voltage drop of the detecting resistor; and a driver configured to drive the motor based on an output voltage of the variable gain amplifier.

The motor may be a voice coil motor.

Any combinations of the above-described elements and mutual substitution of elements and expressions of the present disclosure between a method, an apparatus, a system and the like can be effectively used as other embodiments of the present disclosure.

DETAILED DESCRIPTION

Figure 1:
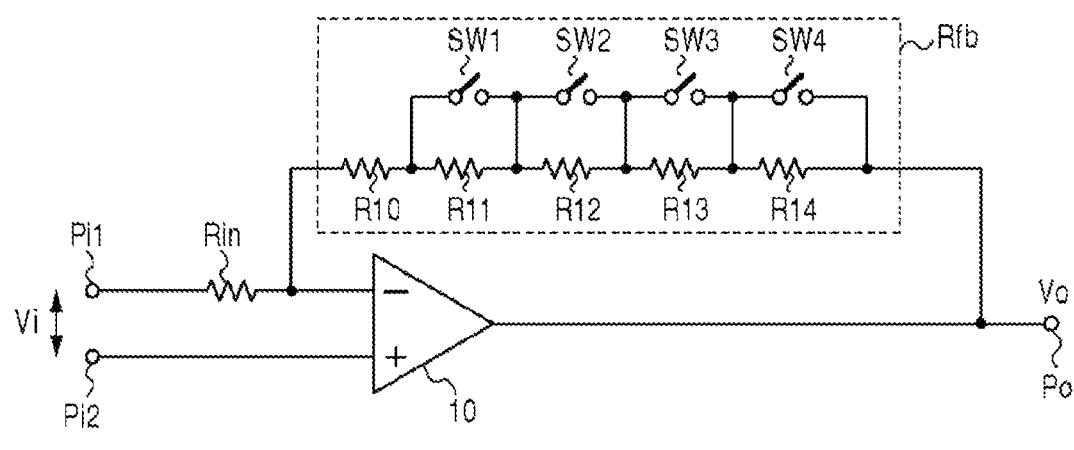
FIG. 1 is a circuit diagram of a conventional variable gain amplifier.

Preferred embodiments of the present disclosure will now be described in detail with reference to the drawings. Throughout the drawings, the same or similar elements, members and processes are denoted by the same reference numerals and explanation of which will not be repeated. The disclosed embodiments are provided for the purpose of illustration, not limitation, of the present disclosure and all features and combinations thereof described in the embodiments cannot be necessarily construed to describe the spirit of the present disclosure.

In the specification, the phrase "connection of a member A and a member B" is intended to include direct physical connection of the member A and the member B as well as indirect connection thereof via other member as long as the other member has no substantial effect on the electrical connection of the member A and the member B or has no damage to functions and effects shown by a combination of the member A and the member B. Similarly, the phrase "interposition of a member C between a member A and a member B" is intended to include direct connection of the member A and the member C or direct connection of the member B and the member C as well as indirect connection thereof via other member as long as the other member has no substantial effect on the electrical connection of the member A, the member B, and the member C or has no damage to functions and effects shown by a combination of the member A, the member B, and the member C.

Figure 2:
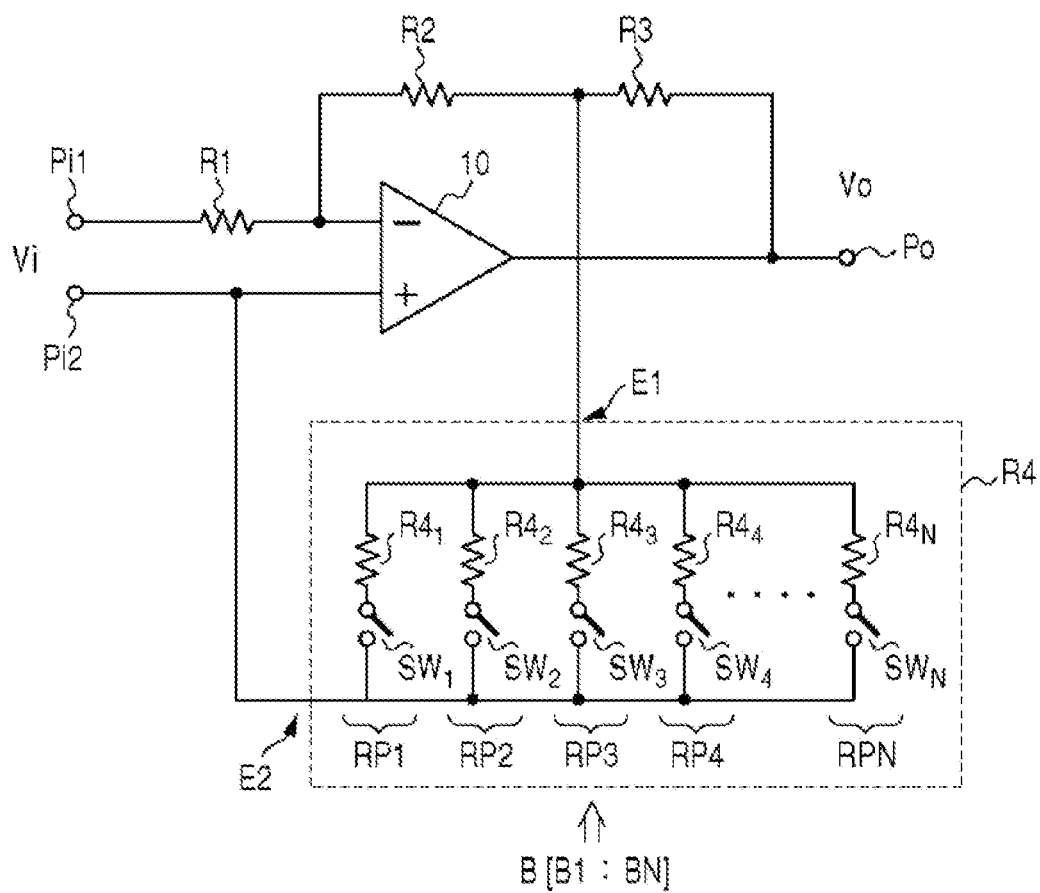
FIG. 2 is a circuit diagram of a variable gain amplifier according to an embodiment of the present disclosure.

FIG. 2 is a circuit diagram of a variable gain amplifier 100 according to an embodiment of the present disclosure. The variable gain amplifier 100 amplifies an input voltage Vi supplied between a first input terminal Pi1 and a second input terminal Pi2 with a gain Av and outputs the amplified input voltage from an output terminal Po.

The variable gain amplifier 100 includes the first input terminal Pi1, the second input terminal Pi2, the output terminal Po, an operational amplifier 10, a first resistor R1, a second resistor R2, a third resistor R3 and a fourth variable resistor R4.

A non-inverted input terminal (+) of the operational amplifier 10 is connected to the second input terminal Pi2 and an output thereof is connected to the output terminal Po. The first resistor R1 is interposed between the first input terminal Pi1 and an inverted input terminal (−) of the operational amplifier 10. The second resistor R2 and the third resistor R3 are interposed in series between the inverted input terminal (−) of the operational amplifier 10 and the output terminal Po. A first terminal E1 of the fourth variable resistor R4 is connected to a node N1 between the second resistor R2 and the third resistor R3 and a second terminal E2 of the fourth variable resistor R4 is connected to the non-inverted input terminal (+) of the operational amplifier 10.

The fourth variable resistor R4 is configured to switch between plural discrete resistances according to a digital control signal. The fourth variable resistor R4 includes a plurality of resistances passes RP1 to RPN interposed in parallel between the first terminal E1 and the second terminal E2. An i-th resistance pass RPi includes a resistor $R4_i$ and a switch $SW_i$ connected in series.

When a resistance across the i-th resistance pass RPi is denoted by $Rp_i$, designed resistances $Rp_1$ to $Rp_N$ across a plurality of corresponding resistance passes RP1 to RPN are binary weighted. In other words, when unit resistance having a predetermined value is denoted by R, a designed resistance $Rp_i$ of the i-th resistance pass RPi is as follows.

$$Rp_i = 2^{(i-1)} \times R$$

When wiring resistance is neglected, a relationship of $Rp_i = R4_i + Ron_i$ is established. $Ron_i$ is on-resistance of the switch SWi. When switches $SW_1$ to $SW_N$ are configured with the same size, on-resistances Ron of all of the switches $SW_i$ to $SW_N$ becomes substantially equal, and their design values are known. Therefore, a design value of the resistor $R4_i$ of the resistance pass RPi is set to the value which is the difference between the design value $Rp_i$ of resistance across the resistance pass RPi and the value of the on-resistance $Ron_i$ of the corresponding switch SWi.

Subsequently, an operation of the variable gain amplifier 100 will be described. The gain Av of the variable gain amplifier 100 is given by the following Equation 4.

$$Av = (R1 + R2 + R1 \times R2/R4)/R1 \quad \text{[Equation 4]}$$

Resistance of the fourth variable resistor R4 is given by the following Equation 5.

$$R4 = 1/Y \quad \text{[Equation 5]}$$

Y is given by the following Equation 6.

$$Y = (B1/Rp_1 + B2/Rp_2 + \ldots + BN/Rp_N) \quad \text{[Equation 6]}$$

Where B1 to BN represent binary control signals to control switching-ON/OFF switch of the switches SW1 to $SW_N$, Bi=1 corresponds to switching-ON of the switch $SW_i$, and Bi=0 corresponds to switching-OFF of the switch $SW_i$.

When Equation 5 is applied to Equation 4, the following Equation 7 is obtained.

$$Av = (R1 + R2 + R1 \times R2 \times Y)R1 = (1 + R2/R1 + R2 \times Y) \quad \text{[Equation 7]}$$

For example, R1, R2, R3, $Rp_i$ and N may be 10 kΩ, 4 kΩ, 46 kΩ, $2^{(i-1)} \times 2.5$ kΩ and 12, respectively. In this case, the gain Av can be varied in a range from 5 to 20 in a step of 0.037.

Figure 3A:
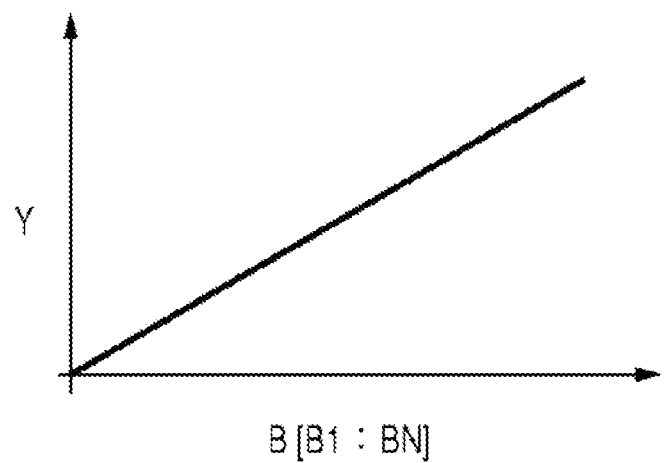
FIGS. 3A and 3B are views showing characteristics of the variable gain amplifier of FIG. 2.
Figure 3B:
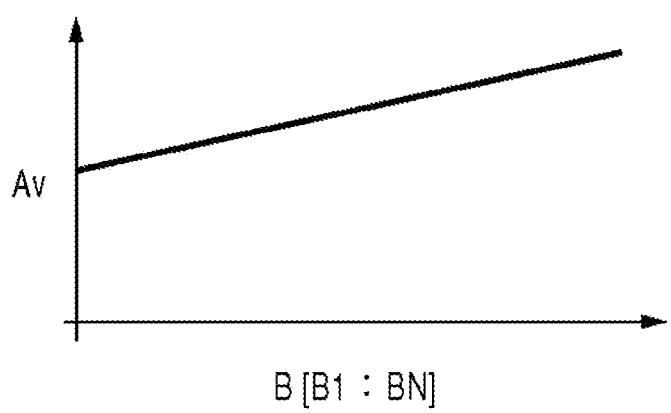

FIGS. 3A and 3B show characteristics of the variable gain amplifier 100. In FIGS. 3A and 3B, a horizontal axis represents binary gain control data B [B1:BN] in decimal numbers, with B1 as MSB (Most Significant Bit) and BN as LSB (Least Significant Bit). A vertical axis in FIG. 3A represents a value Y in Equation 6 and a vertical axis in FIG. 3B represents the gain Av of the variable gain amplifier 100.

As illustrated in FIG. 3A, the value Y is linearly dependent on the gain control data B. Accordingly, as expressed in Equation 7, the gain Av of the variable gain amplifier 100 is also linearly dependent on the gain control data B as shown in FIG. 3B.

Here, the fourth variable resistor R4 is configured to connect the resistor $R4_i$ and the switch $SW_i$ in series. Accordingly, taking into consideration the on-resistance $Ron_i$ of the switch $SW_i$, the resistance (i.e., the value Y) of the fourth variable resistor R4 may be designed with high precision. As a result, the gain Av of the variable gain amplifier 100 may be controlled with high precision.

Figure 4:
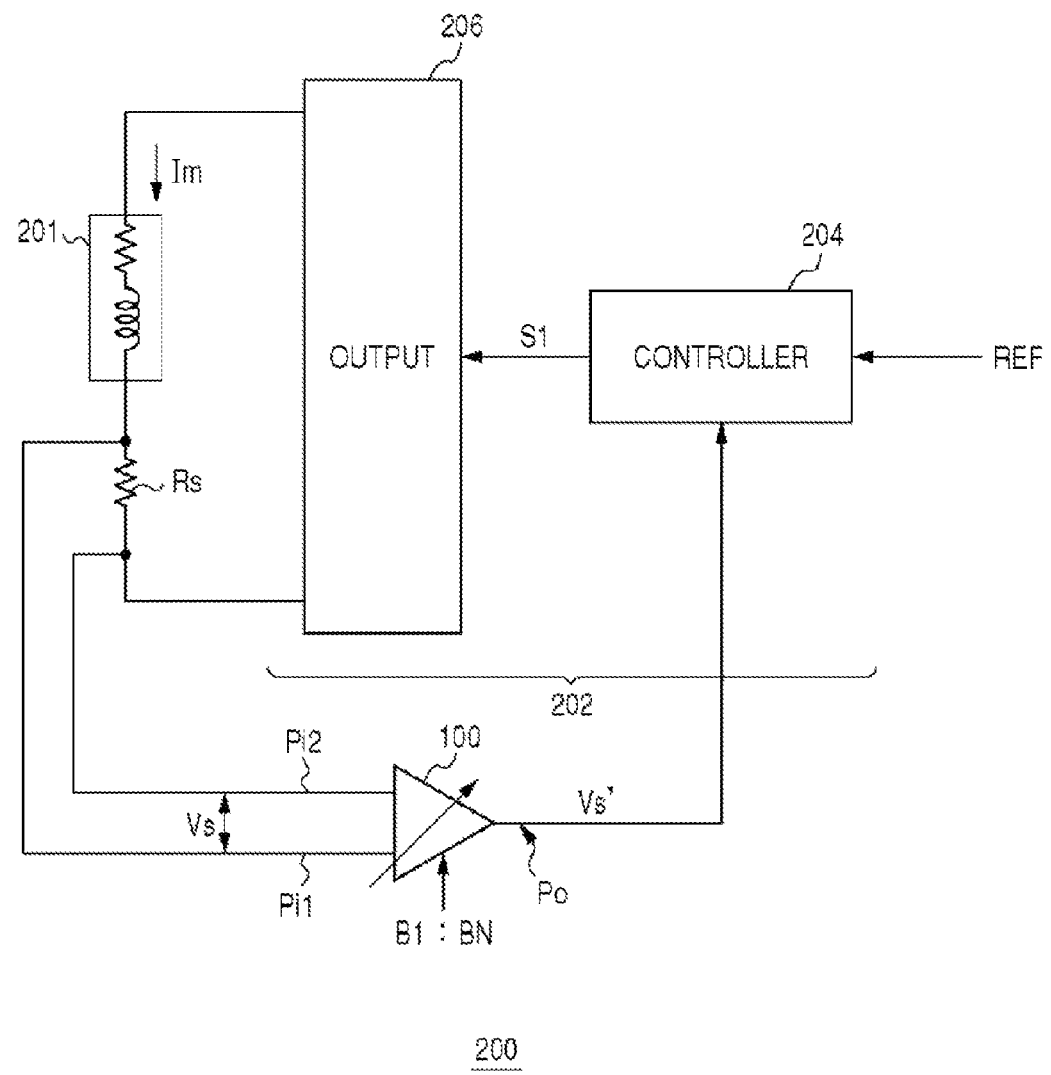
FIG. 4 is a circuit diagram of a motor driving circuit using the variable gain amplifier of FIG. 2.

Subsequently, a usage of the variable gain amplifier 100 will be described. FIG. 4 is a circuit diagram of a motor driving circuit 200 using the variable gain amplifier 100 of FIG. 2. A motor 201 is a voice coil motor serving as, for example, a linear actuator. The motor driving circuit 200 includes a detecting resistor Rs and a driving part 202 in addition to the variable gain amplifier 100. The motor driving circuit 200 detects current Im flowing into the voice coil motor 201 and controls an electric conduction state of the voice coil motor 201 when the detected current reaches a target value, which is indicated by a displacement of a movable element of the voice coil motor 201.

A combination of the variable gain amplifier 100 and the detecting resistor Rs acts as a current detecting circuit. The detecting resistor Rs is disposed on a path of current Im to be detected, and a voltage drop (voltage Vs) proportional to the current Im is produced across the resistor Rs. The variable gain amplifier 100 amplifies the voltage Vs with the gain Av set according to the gain control data B1:BN. An output Vs' of the variable gain amplifier 100 corresponds to a voltage value proportional to the current Im of the motor 201.

The driving part 202 controls a driving voltage supplied across the voice coil motor 201 and the detecting resistor Rs, based on the output voltage Vs' of the variable gain amplifier 100. The driving part 202 includes a controller 204 and an output stage 206. The variable gain amplifier 100 and the driving part 202 may be integrated on a single semiconductor substrate. The output stage 206 drives the voice coil motor 201 in a linear or pulsed (or switching) manner according to a control signal S1 from the controller 204. In case of linear driving, the output stage 206 may be implemented by an analog amplifier. In case of pulsed driving, the output stage 206 may be implemented by a H-bridge circuit, a half-bridge circuit, or the like. The output stage 206 may be configured using techniques known in the art without being particularly limited.

The controller 204 generates the control signal S1 for the output stage 206 such that the output voltage Vs' of the variable gain amplifier 100 reaches a target value REF. The control signal S1 may be an analog voltage for linear driving. Alternatively, the control signal S1 may be a pulsed signal for pulsed driving. The controller 204 may be also configured using techniques known in the art without being particularly limited.

Designed resistance of the detecting resistor Rs may be varied depending on types of devices which the motor driving circuit 200 is equipped with. Designed resistance of the detecting resistor Rs may also be varied depending on the characteristic deviation of the detecting resistor Rs. In addition, a relationship between the current Im and the displacement of the movable element may further be adjusted depending on types of voice coil motors 201. According to this embodiment, the variable gain amplifier 100 can be used to compensate a deviation of the detecting resistor Rs and a characteristic deviation of the voice coil motor 201, which may result in position control with high precision.

Figure 5A:
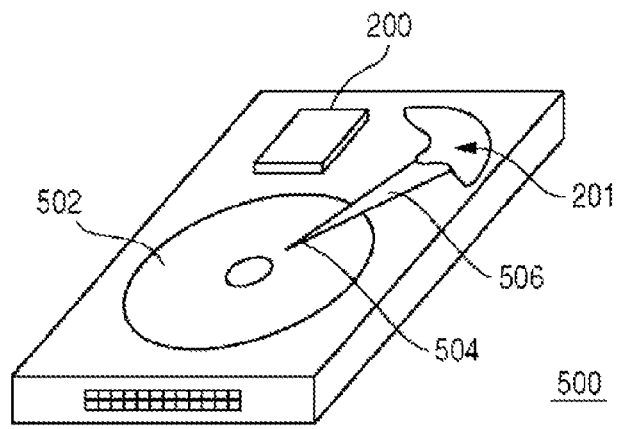
FIGS. 5A to 5C are perspective views showing examples of electronic devices using the motor driving circuit of FIG. 4.
Figure 5B:
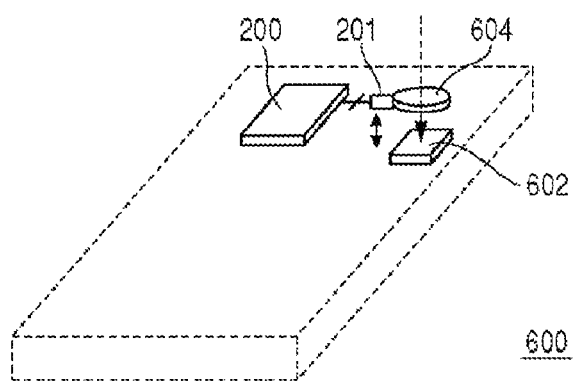
Figure 5C:
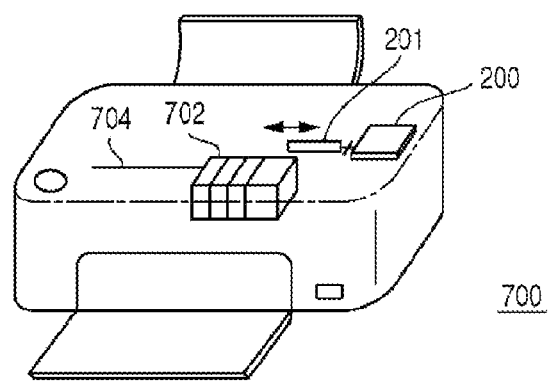

Finally, a usage of the motor driving circuit 200 will be described. The motor driving circuit 200 and the voice coil motor 201 are used for various kinds of electronic devices. FIGS. 5A to 5C are perspective views showing examples of electronic devices including the motor driving circuit 200 of FIG. 4.

An electronic device shown in FIG. 5A is a hard disk device 500. The hard disk device 500 includes a magnetic disk 502, a head 504, and an arm 506. The head 504 is provided to write/read data into/from the magnetic disk 502. The head 504 is attached to a leading end of the arm 506, and a relative position between the head 504 and the magnetic disk 502 is controlled by changing a position of the arm 506. The voice coil motor 201 is provided to actuate the arm 506. The motor driving circuit 200 controls the motor 201. This configuration allows the head 504 to be positioned with high precision.

An electronic device shown in FIG. 5B is a device 600 with imaging function, such as a digital still camera, a digital video camera, a mobile phone, or the like. The device 600 includes an imaging element 602 and an auto-focus lens 604. The voice coil motor 201 performs a positioning operation for the auto-focus lens 604. The motor driving circuit 200 can position the auto-focus lens 604 with high precision by using the configuration of the voice coil motor 201. The motor driving circuit 200 may be used to drive an image stabilizing lens in place of the auto-focus lens 604.

An electronic device shown in FIG. 5C is a printer 700. The printer 700 includes a head 702 and a guide rail 704. The head 702 is supported along the guide rail 704 in a positionable manner. The voice coil motor 201 controls a position of the head 702. The motor driving circuit 200 controls the voice coil motor 201. This configuration allows the head 702 to be positioned with high precision. In addition to controlling a position of the head 702, the motor driving circuit 200 may be used to drive a motor for paper feeding mechanism.

The present disclosure has been described on the basis of the particular embodiments in the above. However, these embodiments are only illustrative, and it is to be understood by those skilled in the art that combinations of various elements thereof and combinations of various processes thereof may be modified in different ways and such modifications fall within the scope of the present disclosure. Some of the modifications will be described below.

Although it has been illustrated in the above embodiments that the resistance values of the resistance passes of the fourth variable resistor R4 are binary weighted, a method of determining the resistance values of the resistance passes of the fourth variable resistor R4 is arbitrary, and may depend on a required step of the gain Av.

Although it has been illustrated in the above embodiments that the motor to be driven is the voice coil motor, the usage of the motor driving circuit 200 is not limited thereto but the motor driving circuit 200 may be used to drive a spindle motor or other motors.

In addition, although it has been illustrated in the above embodiments that the variable gain amplifier 100 is used for the current detecting circuit and the motor driving circuit 200, the present disclosure is not limited thereto but may be used to amplify any voltage.

According to the present disclosure in some embodiments, it is possible to control the gain of the variable gain amplifier with high precision.

While certain embodiments have been described, these embodiments have been presented by way of example only, and are not intended to limit the scope of the disclosures. Indeed, the methods and apparatuses described herein may be embodied in a variety of other forms; furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A variable gain amplifier comprising:
a first input terminal, a second input terminal and an output terminal;
an operational amplifier having a non-inverted input terminal connected to the second input terminal and an output connected to the output terminal;
a first resistor interposed between the first input terminal and an inverted input terminal of the operational amplifier;
second and third resistors interposed in series between the inverted input terminal of the operational amplifier and the output terminal; and
a fourth variable resistor having a first terminal connected to a node between the second resistor and the third resistor and a second terminal connected to the non-inverted input terminal of the operational amplifier,
wherein the fourth variable resistor includes a plurality of resistance passes interposed in parallel between the first terminal and the second terminal, each of the resistance passes including a resistor and a switch connected in series.

2. The variable gain amplifier of claim 1, wherein a designed resistance across each of the resistance passes is binary weighted.

3. The variable gain amplifier of claim 2, wherein a design value of the resistor of each of the resistance passes is a value corresponding to a subtraction of on-resistance of a corresponding switch from a designed resistance across the resistance pass.

4. The variable gain amplifier of claim 1, wherein the variable gain amplifier is integrated on a single semiconductor substrate.

5. A current detecting circuit comprising:
a detecting resistor disposed on a path of current to be detected; and
a variable gain amplifier of claim 1, wherein the variable gain amplifier has a first input terminal connected to one end of the detecting resistor and a second input terminal connected to the other end of the detecting resistor and amplifies a voltage drop of the detecting resistor.

6. A motor driving circuit comprising:
a detecting resistor disposed on a path of a motor to be driven;
a variable gain amplifier of claim 1, wherein the variable gain amplifier has a first input terminal connected to one end of the detecting resistor and a second input terminal connected to the other end of the detecting resistor and amplifies a voltage drop of the detecting resistor; and
a driver configured to drive the motor based on an output voltage of the variable gain amplifier.

7. An electronic apparatus comprising:
a motor; and
a motor driving circuit configured to drive the motor,
wherein the motor driving circuit includes:
a detecting resistor disposed on a path of the motor to be driven;
a variable gain amplifier of claim 1, wherein the variable gain amplifier has a first input terminal connected to one end of the detecting resistor and a second input terminal connected to the other end of the detecting resistor and amplifies a voltage drop of the detecting resistor; and
a driver configured to drive the motor based on an output voltage of the variable gain amplifier.

8. The electronic apparatus of claim 7, wherein the motor is a voice coil motor.

* * * * *